(12) United States Patent
Nagaoki et al.

(10) Patent No.: US 7,838,834 B2
(45) Date of Patent: Nov. 23, 2010

(54) IMAGE FORMING METHOD AND ELECTRON MICROSCOPE

(75) Inventors: Isao Nagaoki, Hitachinaka (JP); Yoshihiko Nakayama, Hitachinaka (JP); Ryoichi Ishii, Hitachinaka (JP)

(73) Assignee: Hitachi-High Technologies Corporation, Tokyo (JP)

( * ) Notice: Subject to any disclaimer, the term of this patent is extended or adjusted under 35 U.S.C. 154(b) by 285 days.

(21) Appl. No.: 12/048,775

(22) Filed: Mar. 14, 2008

(65) Prior Publication Data
US 2008/0224040 A1 Sep. 18, 2008

(30) Foreign Application Priority Data
Mar. 15, 2007 (JP) .............................. 2007-065979

(51) Int. Cl.
*G01N 23/04* (2006.01)
(52) U.S. Cl. .................. 250/311; 250/306; 250/307; 250/310
(58) Field of Classification Search .................. 250/311, 250/306, 307, 310
See application file for complete search history.

(56) References Cited

U.S. PATENT DOCUMENTS

| | | | | |
|---|---|---|---|---|
| 6,570,157 B1 * | 5/2003 | Singh et al. | .................. | 250/311 |
| 6,756,589 B1 * | 6/2004 | Obara et al. | .................. | 250/306 |
| 6,852,974 B2 * | 2/2005 | Kochi et al. | .................. | 250/311 |
| 6,878,934 B2 * | 4/2005 | Inada et al. | .................. | 250/307 |
| 6,982,420 B2 * | 1/2006 | Nakazawa et al. | .......... | 250/311 |
| 7,012,254 B2 * | 3/2006 | Inada et al. | .................. | 250/311 |
| 7,022,989 B2 * | 4/2006 | Inada et al. | .................. | 250/311 |
| 7,064,326 B2 * | 6/2006 | Furukawa et al. | ........... | 250/311 |
| 7,164,129 B2 * | 1/2007 | Inada et al. | .................. | 250/311 |
| 7,214,938 B2 * | 5/2007 | Nakazawa et al. | .......... | 250/311 |
| 7,544,936 B2 * | 6/2009 | Inada et al. | .................. | 250/307 |
| 2002/0027199 A1 * | 3/2002 | Inada et al. | .................. | 250/311 |
| 2003/0183762 A1 * | 10/2003 | Nagaoki et al. | ............. | 250/307 |
| 2004/0114788 A1 * | 6/2004 | Nakazawa et al. | .......... | 382/128 |
| 2004/0173749 A1 * | 9/2004 | Inada et al. | .................. | 250/311 |
| 2004/0218806 A1 * | 11/2004 | Miyamoto et al. | .......... | 382/145 |
| 2005/0029452 A1 * | 2/2005 | Furukawa et al. | ........... | 250/311 |
| 2005/0035293 A1 * | 2/2005 | Inada et al. | .................. | 250/311 |
| 2005/0161601 A1 * | 7/2005 | Kochi et al. | .................. | 250/311 |
| 2006/0011838 A1 * | 1/2006 | Nakazawa et al. | .......... | 250/311 |
| 2006/0097169 A1 * | 5/2006 | Inada et al. | .................. | 250/311 |
| 2007/0176103 A1 * | 8/2007 | Inada et al. | .................. | 250/311 |

FOREIGN PATENT DOCUMENTS

JP 2005-19218 A 1/2005

* cited by examiner

*Primary Examiner*—Jack I Berman
*Assistant Examiner*—Michael Maskell
(74) *Attorney, Agent, or Firm*—Crowell & Moring LLP

(57) ABSTRACT

As an image forming method including comparison between images for three-dimensional image construction or the like and an apparatus for forming such images, there are provided an image forming method and an electron microscope capable of obtaining with high accuracy or efficiency information required for comparison. In the image forming method, an image is formed on the basis of comparison between a plurality of images obtained by applying an electron beam to a specimen at different tilt angles. The method includes obtaining a first transmission image with the electron beam applied in a first direction and a second transmission image with the electron beam applied in a second direction, the second transmission image being formed within a region different from a peripheral blurred region resulting from tilting, and making a search in the first transmission image by using the second transmission image.

10 Claims, 21 Drawing Sheets

Magnetic field
in front of objective

SPIRAL TYPE (a)        (b)

IMAGE FORMING METHOD AND ELECTRON MICROSCOPE

BACKGROUND OF THE INVENTION

1. Field of the Invention

The present invention relates to an electron microscope and, more particularly, to a method and an electron microscope for forming an image on the basis of comparison between images obtained by tilting a specimen or an electron beam.

2. Background Art

JP Patent Publication (Kokai) No. 2005-19218 (corresponding to U.S. Pat. No. 7,064,326) describes an example of a technique to construct a three-dimensional-construction image of a specimen by changing the angle at which an electron beam is applied to the specimen and combining images (transmission images) obtained at a plurality of angles. Through a three-dimensional image of a specimen constructed by such a method, the cubic structure of the specimen can be analyzed.

JP Patent Publication (Kokai) No. 2005-19218 also describes an example of performing three-dimensional reconstruction in which a shift of the position of a specimen is corrected by selectively cutting, by means of two-dimensional correlation processing with respect to a reference image, the same visual field out of a series of transmission images of a specimen obtained in a tilting manner.

SUMMARY OF THE INVENTION

In a transmission electron microscope, if an image is taken in for three-dimensional construction in a state where the tilt angle of a stage or a beam is increased, a peripheral blur occurs due to the tilt and, therefore, the degree of matching between an image at a large tilt and an image at a smaller tilt is reduced. If positioning based on the degree of matching between such images, suitable three-dimensional image construction cannot be performed. There is also a problem that setting of the degree of matching itself is difficult to perform. FIG. 26 is a graph showing changes in correlation between a reference image and a tilted image. The ordinate represents the degree of matching, and the abscissa represents the tilt angle.

JP Patent Publication (Kokai) No. 2005-19218 describes a technique to correct a position shift by searching the same visual field as a reference image, but includes no consideration of the existence of a peripheral blurred region resulting from tilting.

Also, in a visual field including a characteristic contrast in a portion of an image as shown in FIG. 15, there is a possibility of the visual field being corrected in a shifted state. Further, there is a problem that the existence of a blur leads to a reduction degree of matching in high magnification, as shown in FIG. 24, and a reduction in correction accuracy also results.

The present invention provides, as an image forming method including comparison between images for three-dimensional image construction or the like and an apparatus for forming such images, an image forming method and an electron microscope capable of obtaining with high accuracy or efficiency information required for comparison.

To solve the above-described problems, according to one aspect of the present invention, there is provided an image forming method in which an image is formed on the basis of comparison between a plurality of images obtained by applying an electron beam to a specimen at different tilt angles, the method including obtaining a first transmission image with the electron beam applied in a first direction and a second transmission image with the electron beam applied in a direction different from the first direction, the second transmission image corresponding to an area on the specimen smaller than that corresponding to the first image, the second transmission image being formed within a region different from a peripheral blurred region resulting from tilting, and making a search in the first transmission image by using the second transmission image, and there is also provided an apparatus for image forming in accordance with the image forming method.

According to the above-described aspect of the present invention, a high search accuracy can be obtained regardless of the existence of the peripheral blurred region caused due to tilting of the beam or the specimen in a method and apparatus for forming an image with comparison between images.

DETAILED DESCRIPTION OF THE PREFERRED EMBODIMENTS

A concrete example of a three-dimensional image construction method using a transmission electron microscope will be described as one form of implementation of the present invention. A transmission electron microscope will be described as one form of implementation. The transmission electron microscope described below has an electron gun, a converging lens through which an electron beam is applied to a specimen, a mechanism for deflecting the electron beam, the specimen, an objective lens which is focused on the specimen, an imaging lens which expands the electron beam transmitted through the specimen, a mechanism for taking in a transmission image as image data, a mechanism for computing a luminance distribution of image data, and a mechanism for making comparison between the luminance distribution of image data after changing an objective lens current and the luminance distribution of image data before changing the luminance distribution and the objective lens, and a monitor which displays values for the results of comparison between the luminance distributions and the transmission image.

Techniques described below are conceivable as techniques to compute, for example, the amount of movement between images in the above-described comparison step.

Figure 20:
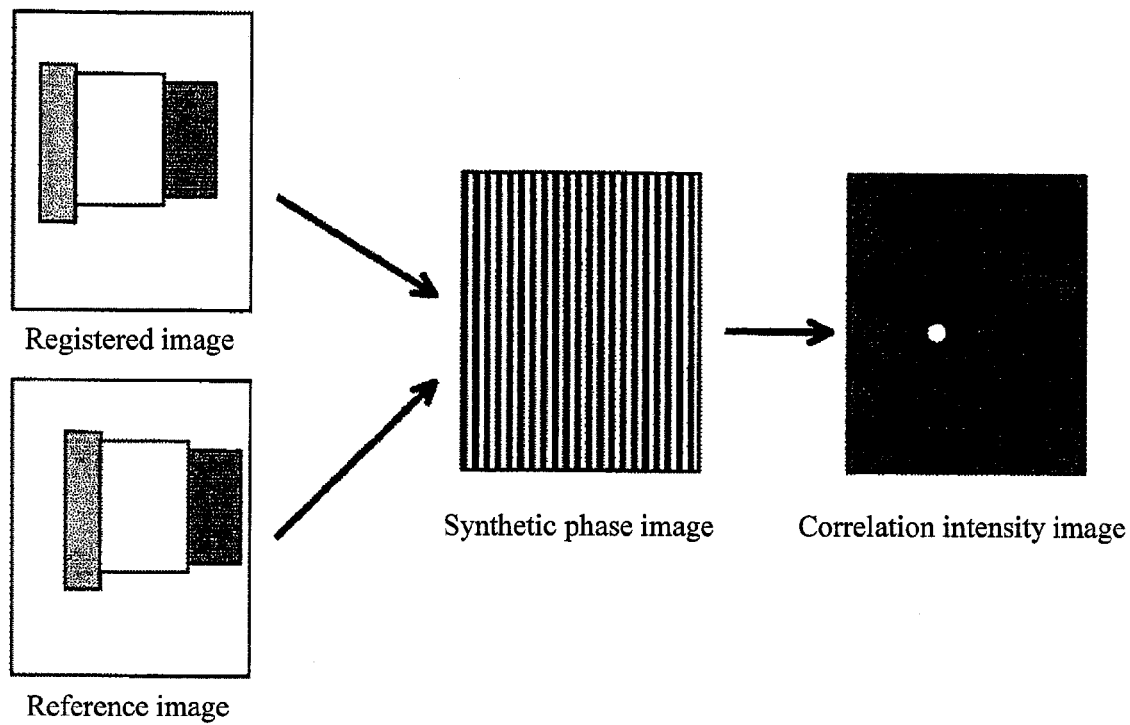
FIG. 20 is a diagram showing an example of computation of correlation between two images.

About a Computation Method Used in this Example (A) Technique to Compute the Amount of Movement by Phase-Limited Correlation The operation of the transmission electron microscope having the above-described construction will be described by using an example of image correlation shown in FIG. 20. A portion of transmission image (1) is cut out as a transmission image (3) is recorded in a storage device as a registered image having a number of pixels M×N and expressed by f1(m, n). Subsequently, a transmission image (2) taken in after a recording mode is recorded in the storage device as a reference image having a number of pixels M×N and expressed by f2(m, n).

Each image is a natural image, m=0, 1, 2, ... M−1, and n=0, 1, 2, ... N−1.

Discrete Fourier images F1(m, n) and F2(m, n) of f1(m, n) and f2(m, n) are respectively defined by (1) and (2):

$$F1(u,v)=A(u,v)ej\theta(u,v) \quad (1)$$

$$F2(u,v)=B(u,v)ej\phi(u,v) \quad (2)$$

In these equations, u=0, 1, 2 ... M−1; v=0, 1, 2 ... N−1; A(u, v) and B(u, v) are amplitude spectra; and θ(u, v) and φ(u, v) are phase spectra.

In phase correlation, when an parallel image movement between two images occurs, the position of a peak of correlation is shifted by a value corresponding to the amount of movement. A method of driving the amount of movement will be described.

First, a move of the original image f2(m, n) by r' in the x-direction and f4(m, n)=f2(m+r', n) are assumed. Equation (2) is transformed into equation (3):

$$F4(u, v) = \Sigma\Sigma f2(m + r', n)e - j2\pi(mu/M + nv/N) \quad (3)$$
$$= B(u, v)ej(\phi + 2\pi r'u/M)$$

If the amplitude spectrum B (u, v) is constant, a phase image independent of image contrast results. A phase image F'4(u, v) of f4 is shown by equation (4):

$$F4'(u,v)=ej(\phi+2\pi r'u/M) \quad (4)$$

A phase image F'1(u, v) is multiplied by the complex conjugate of F'2(u, v) to obtain a synthetic image H14(u, v) shown by equation (5):

$$H14(u, v) = F'1(u, v)(F'2(u, v)* \quad (5)$$
$$= ej(\theta - \phi - 2\pi ru/M)$$

A correlation intensity image G14(r, s) shown by equation (6) below is obtained by inverse Fourier transform of the synthetic image H14(u, v).

$$G14(r, s) = \Sigma\Sigma(H14(u, v))ej2\pi(ur/M + us/N) \quad (6)$$
$$= \Sigma\Sigma(ej(\theta - \phi - 2\pi r'u/M))ej2\pi(ur/M + us/N)$$
$$= G12(r - r')$$

According to equation (6), if a position shift R' in the x-direction exists between the two images, the position of a peak of the correlation intensity image is shifted by −r'. Since the correlation is computed from phase components, the amount of movement can be computed even if the two images differ in lightness and contrast. If a position shift in the x-direction exists between the two images, a peak occurs at a position of ΔG (pixels) from the center of the correlation intensity image. For example, a correlation intensity image such as shown in FIG. 20 can be formed.

For example, if a shift in the x-direction by 2 pixels exists between the two images, the resulting synthetic image is waves having two kinds of periods. This image is inverse Fourier transformed to obtain a correlation intensity image in which a peak occurs at a position shifted by 2 pixels from the center. This ΔG (pixels) corresponds to the amount of movement on the light receiving surface of a sensor and is converted into the amount of movement Δx on the specimen surface. If the diameter of the light receiving surface of the sensor is L; the magnification of the transmission electron microscope on the light receiving surface is M; and the number of pixels on the light receiving surface of the sensor is Lm, Δx is as shown by equation (7).

$$\Delta x=\Delta G(\text{pixels})\times L/Lm(\text{pixels})/M \quad (7)$$

Δx is the amount of movement on the specimen surface between the two images.

(B) Technique to Compute the Degree of Matching

Description will be made of the accuracy of the amount of movement between images, magnification and angle of rotation. In phase computation using only phase components, a peak appearing in correlation intensity is a δ peak because only the phase is mathematically used. For example, if a shift by 1.5 pixels occurs between two images, the resulting synthetic image is waves of a period 1.5. When this image is inverse Fourier transformed, a peak rises at a position shifted by 1.5 pixels from the center of the correlation intensity image. However, no pixel exists at the 1.5-pixel position and the value of δ peak is therefore divided into values at the first and second pixels.

Then the centroid of pixels having a high degree of matching is taken and the true δ peak position is computed from the divided values. The computation result is obtained with an accuracy of about 1/10 pixel. Also, since the peak of the correlation intensity image is a δ peak, the similarity between the two images is evaluated from the height of the peak of the correlation intensity image. For the image f1(m, n), if the height of the peak is "Peak" (pixels), the degree of matching (%) is shown by equation (8):

Degree of matching(%)=(Peak)/(m×n)×100     (8)

For example, if the number of pixels to be processed is 128×128 pixels, and if "Peak" is 16384 (pixels), the degree of matching=(16384)/(128×128)×100=100(%).

(C) Processing Using Pattern Matching

An example of template image searching by image template matching is shown below.

Correlation computation shown by equation (9) is performed with respect to all pixels in a designated area of a source image, and a point at which the matching degree coefficient (r) is maximized (1.0) is detected as an amount of movement. The degree of matching is defined as r×100.

[Formula 1]

$$r^2 = \frac{\{n\sum fg - \sum f \sum g\}^2}{\{n\sum f^2 - (\sum f)^2\}\{n\sum g^2 - (\sum g)^2\}} \quad (9)$$

f: Source image
g: Template image
n: Number of effective pixels in template area
(1≦n≦=65536:256×256)

If this method is used, the degree of matching is increased under variation in lightness and blurring because computation by the correlation coefficient computation equation itself normalizes data.

Figure 22:
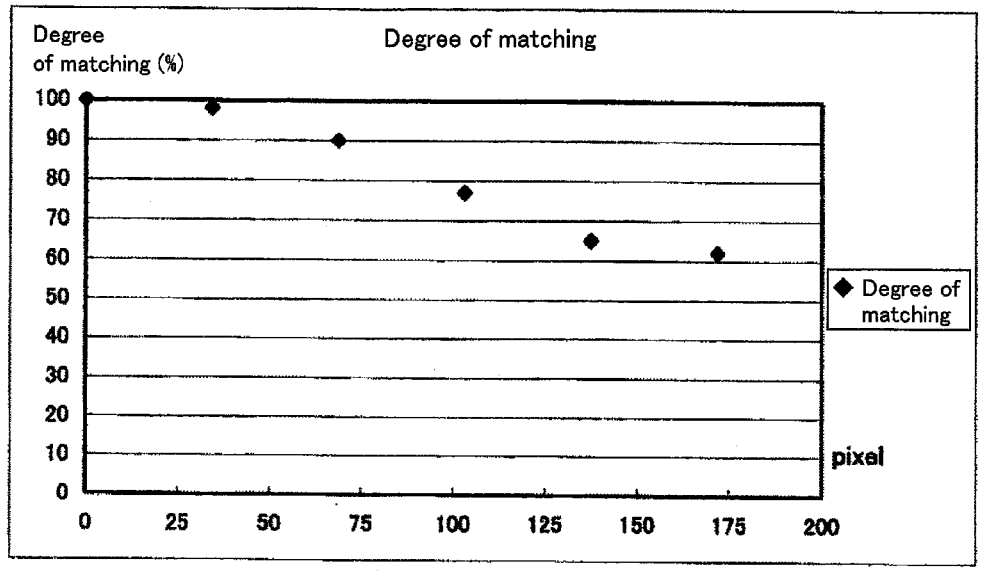
FIG. 22 is a diagram showing the relationship between the amount of movement and the degree of matching at the time of defocusing.
Figure 23:
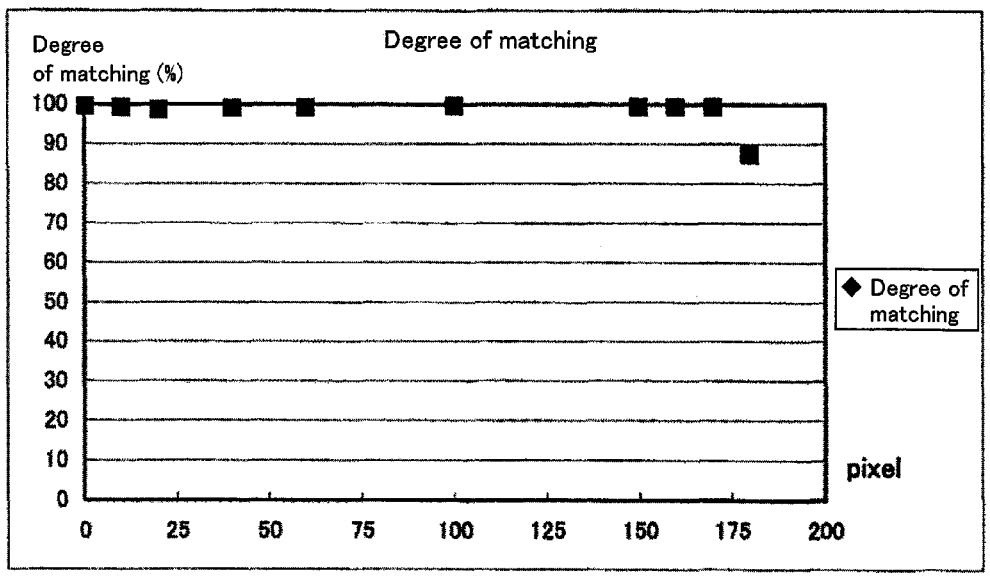
FIG. 23 is a diagram showing the relationship between the amount of movement and the degree of matching at the time of defocusing in an embodiment of the present invention.
Figure 24:
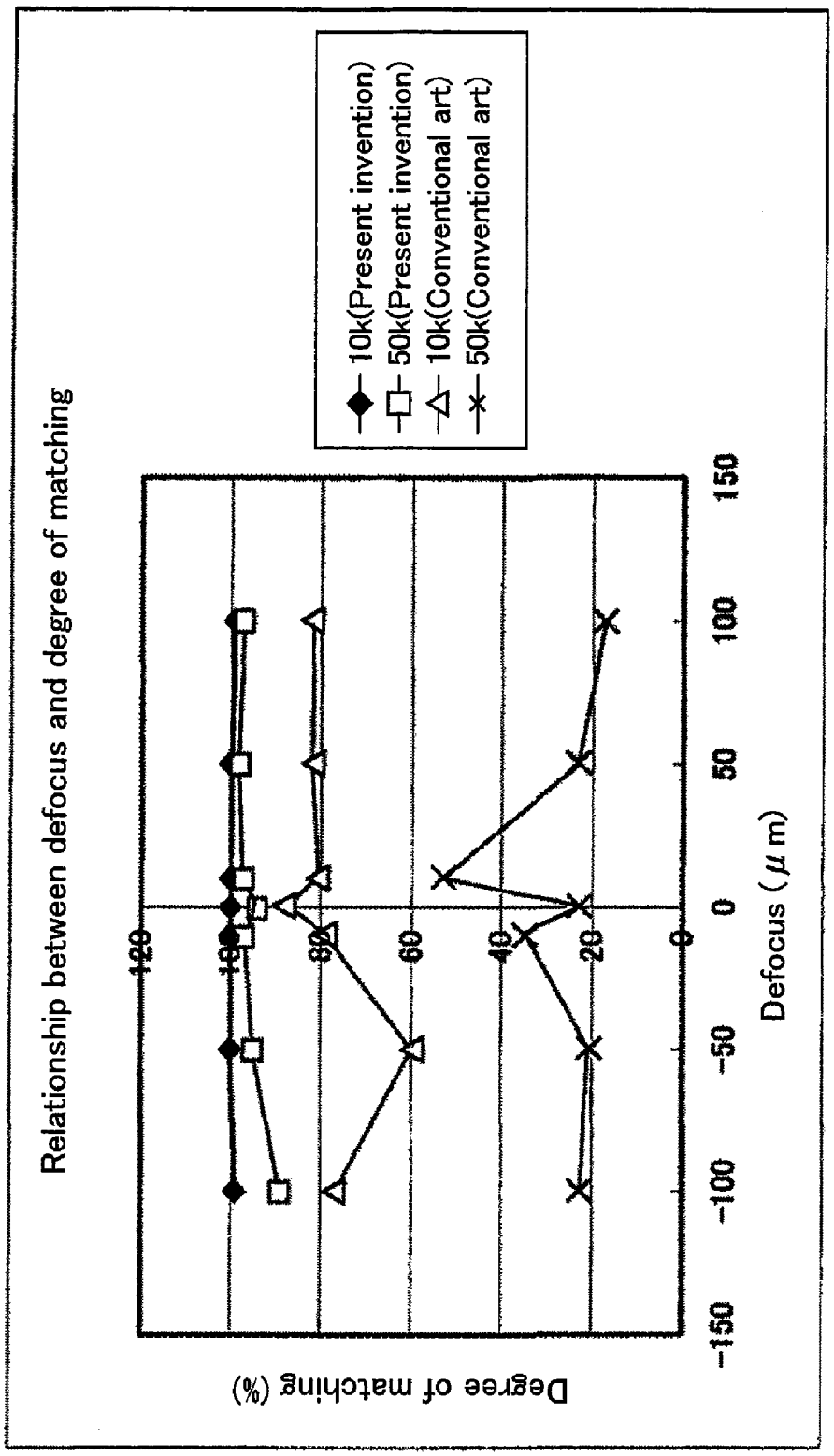
FIG. 24 is a diagram showing the relationship between a defocus and the degree of matching.

FIG. 22 shows the relationship between blurring (defocus) and the amount of movement in the conventional art. FIG. 23 shows the relationship between blurring and the amount of movement in the present invention. As can be also understood from these results, the method of the present invention ensures a higher degree of recognition under blurring.

Figure 18:
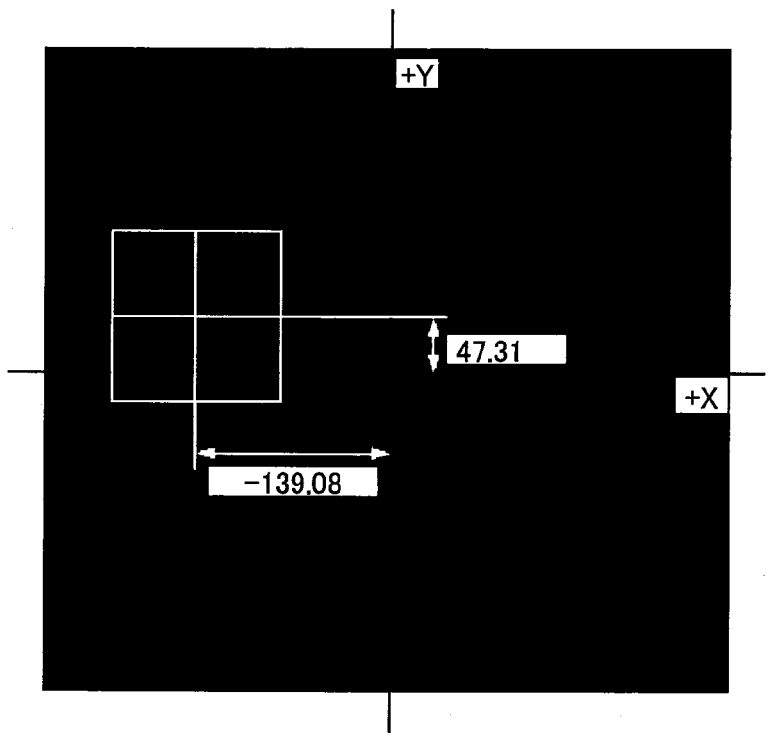
FIG. 18 is a diagram showing an example of measurement of the amount of movement by means of a template.
Figure 19:
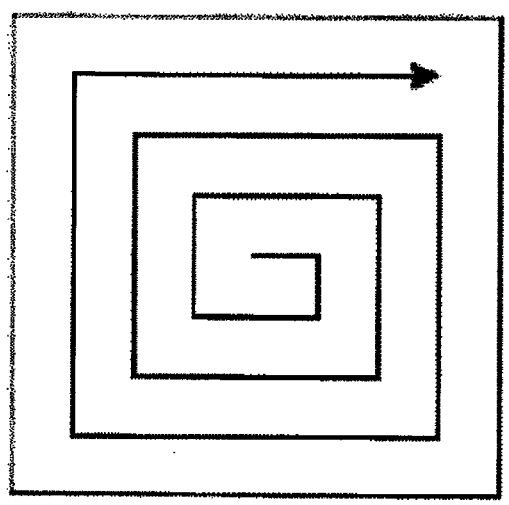
FIG. 19 is a diagram showing an example of a method of measuring the amount of movement.
Figure 21:
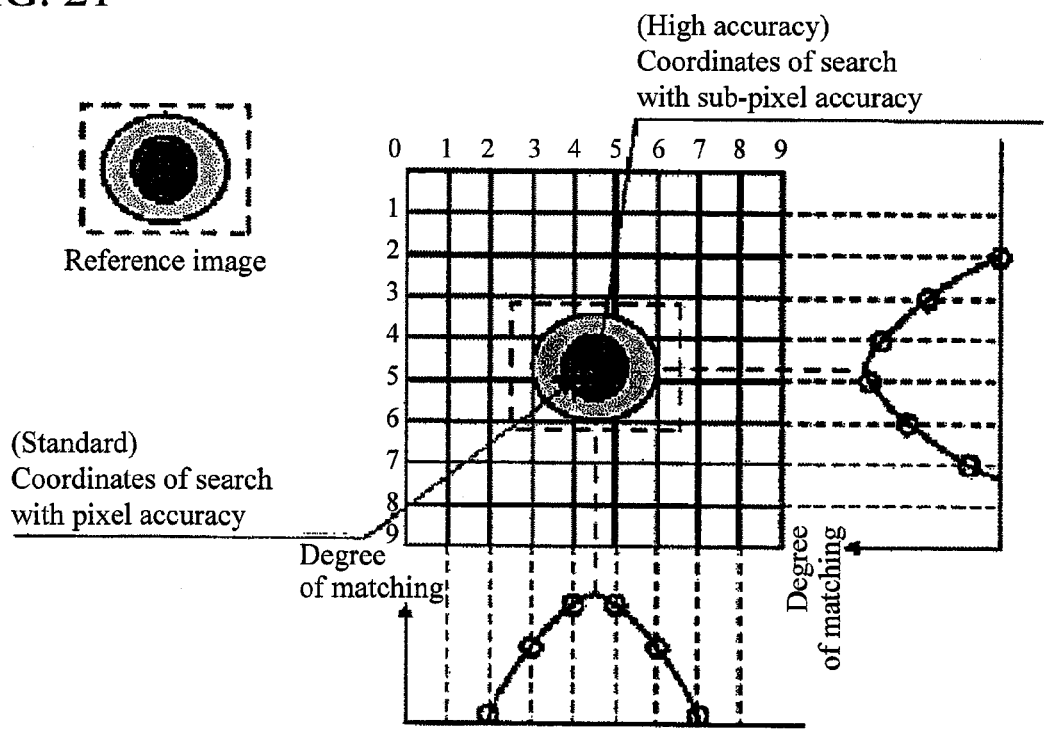
FIG. 21 is a diagram showing an example of a method of computing the degree of matching.

The computation is performed on the area of the template image and one corresponding area of the source image. For a normalized correlation search in accordance with the present invention, three stages: a setup stage, a training stage and a search stage are set. In the setup stage, the template image is cut out of an input image. In the training stage, the cut-out image is registered as a template image for a normalized correlation search. In the search stage, a search with the template registered in the training stage is made. In computation of the amount of movement, the moved position is computed as shown in FIG. 18, and the amount of movement is computed with sub-pixel accuracy as shown in FIG. 21. In automatic adjustment, the image is moved about the image center. Therefore the search efficiency is improved if the search is made in a spiraling manner as shown in FIG. 19.

(D) Processing Using Neural Net

Figure 16:
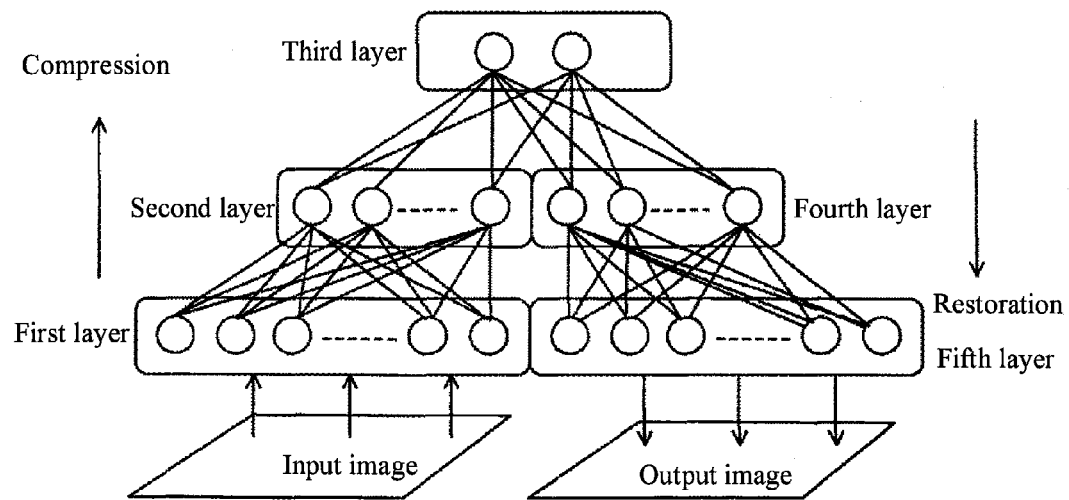
FIG. 16 is a diagram showing the concept of a neural net.
Figure 17:
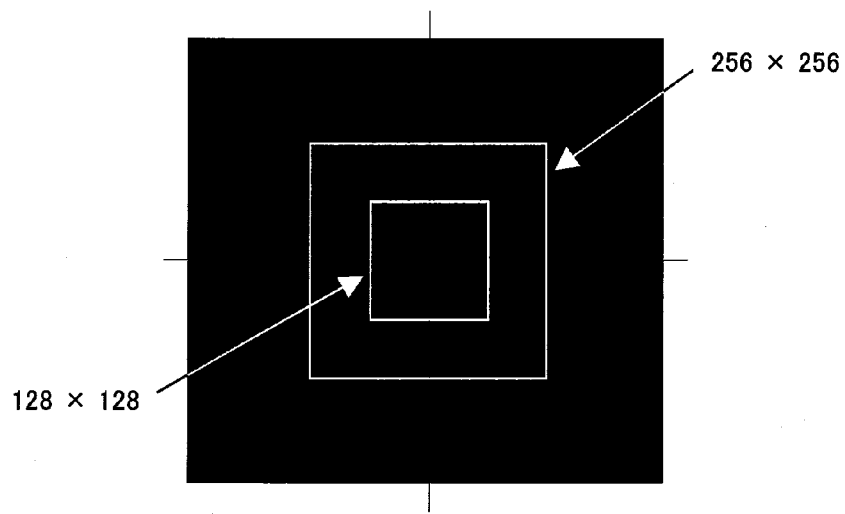
FIG. 17 is a diagram showing an example of template registration on an image.

As shown in FIGS. 16 and 17, processing with a compression/restoration neural net is performed under such a condition that differences between an input image and a restored image are reduced. On a smoothed image, however, many pixels having shade values equal to each other exist. To realize this conversion method, therefore, a cost function with addition of a restrictive condition for smoothing a grid distortion is minimized for a unique solution by a method of steepest descent. The cost function is shown by equation (10):

[Formula 2]

$$\sum_{i,j}[I(dx_{i,j}, dy_{i,j}) - R(I)]^2 + \\ \lambda \sum_{i,j}[(dx_{i+1,j} - dx_{i,j})^2 + (dx_{i,j+1} - dx_{i,j})^2 + \\ (dy_{i+1,j} - dy_{i,j})^2 + (dy_{i,j+1} - dy_{i,j})^2] \quad (10)$$

In the above equation, I represents a resampled image, R represents a restored image; $(dx_{i,j}, dy_{i,j})$ represents an estimated value of a movement vector in a grid (i, j).

(E) Technique to Automatically Correct Focus

An amount of defocus Δf is computed by substituting in equation (11) ΔX computed by equation (7).

$$\Delta f = \Delta X/(\alpha \times M) - CS \times \alpha^2 \quad (11)$$

Figure 25:
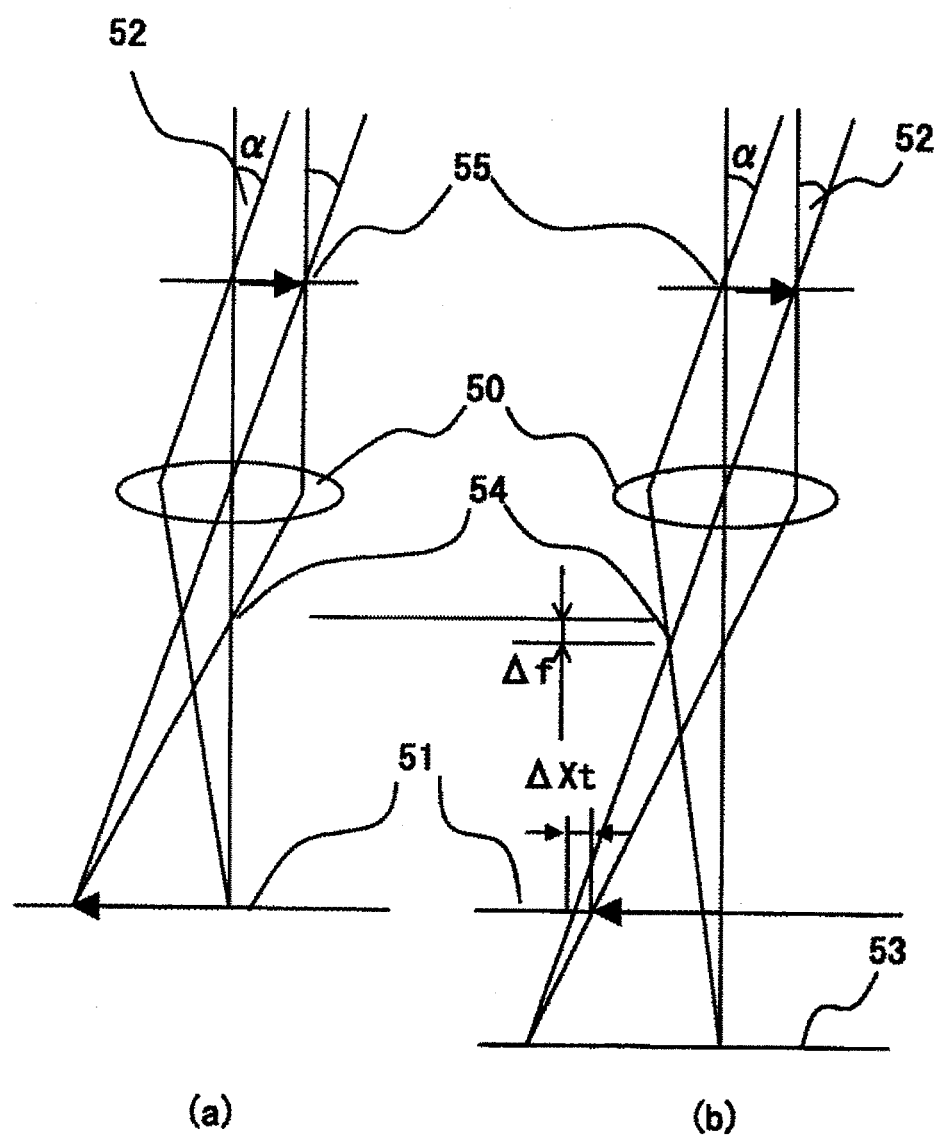
FIG. 25 is a diagram showing an example of an automatic focusing method.
Figure 26:
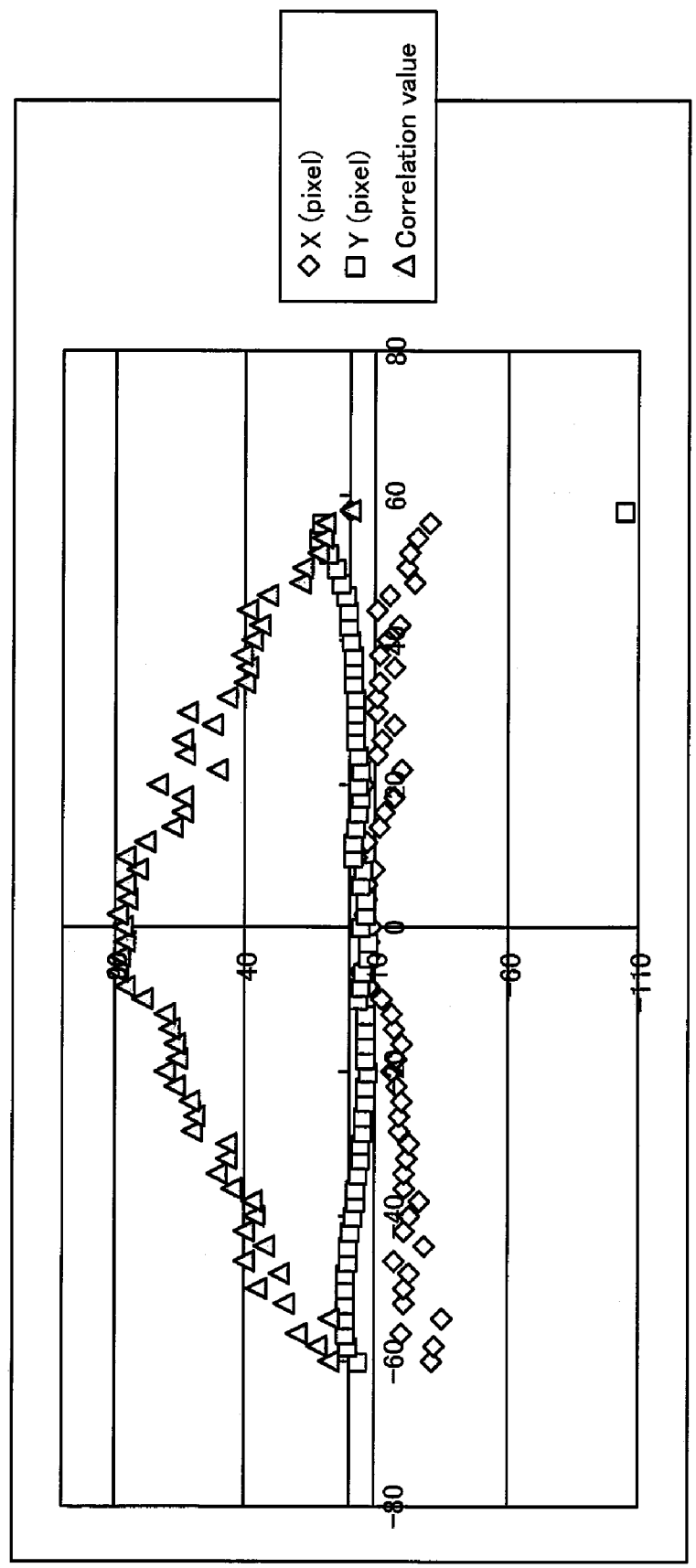
FIG. 26 is a diagram showing the relationship between the amount of image movement and the degree of matching at the time of specimen tilting.

FIG. 25 is a diagram showing the principle of automatic focusing used in this example.

Embodiment 1

Figure 1:
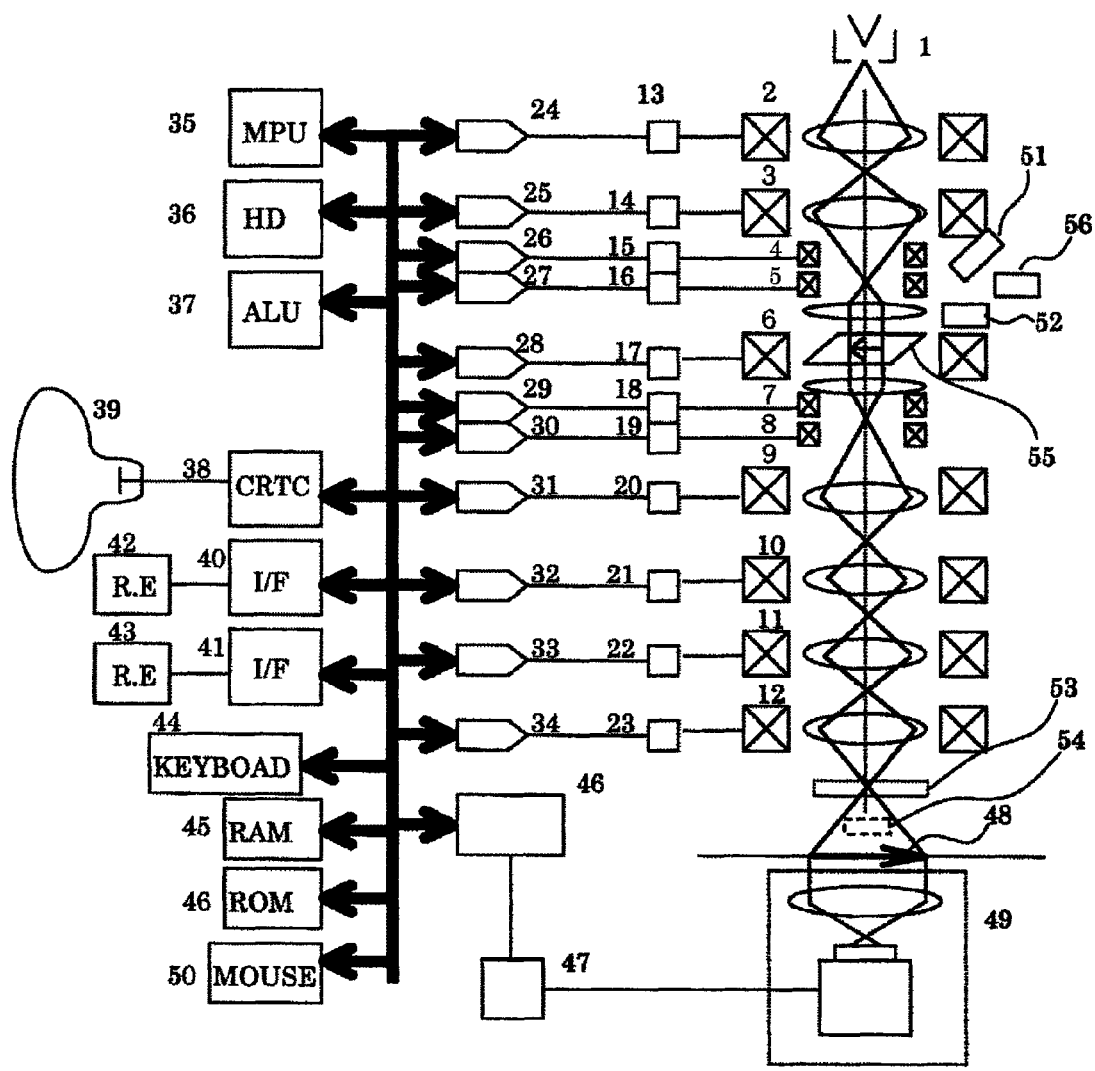
FIG. 1 is a diagram outlining a transmission electron microscope.
Figure 2:
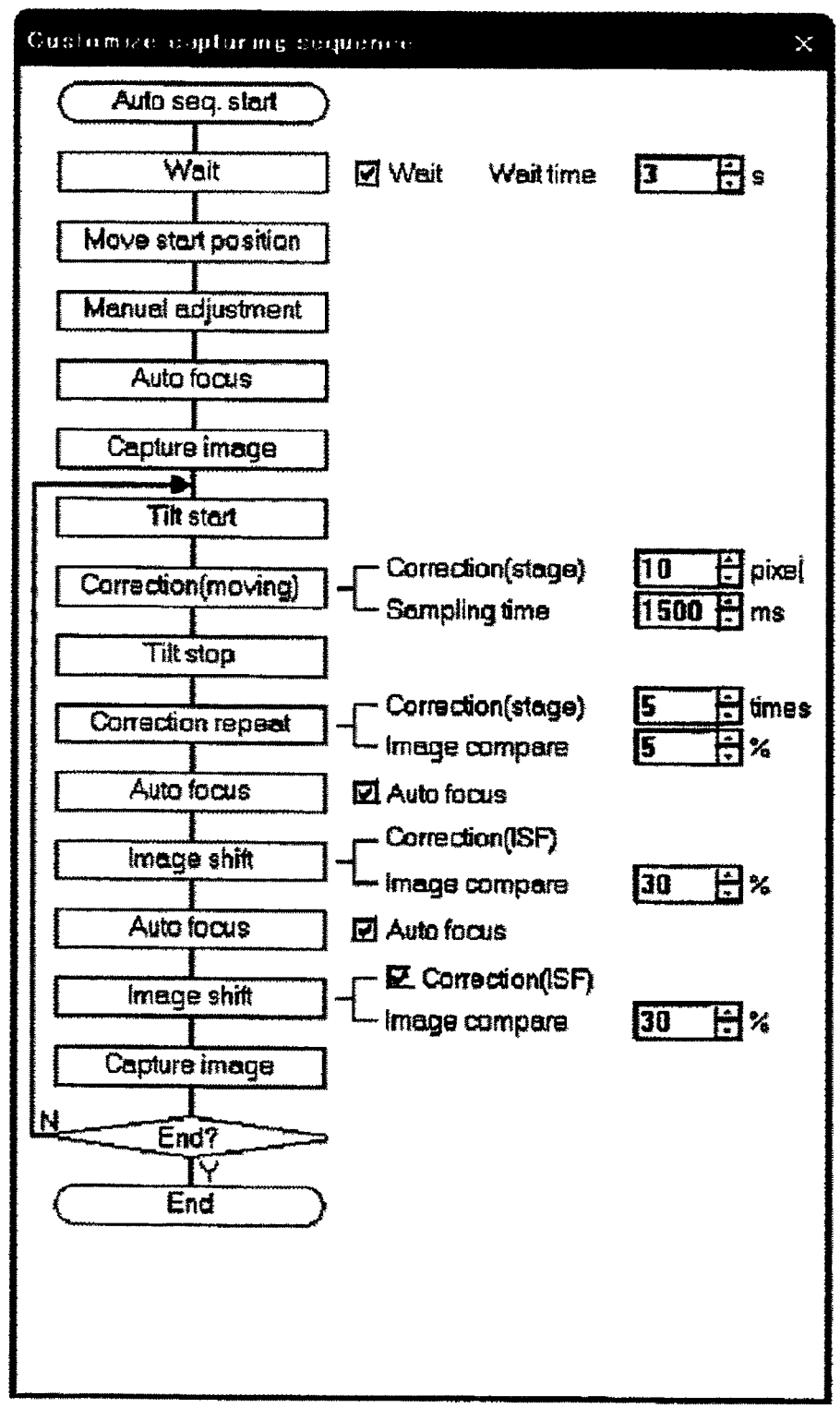
FIG. 2 is a flowchart showing the operation of the transmission electron microscope.
Figure 7:
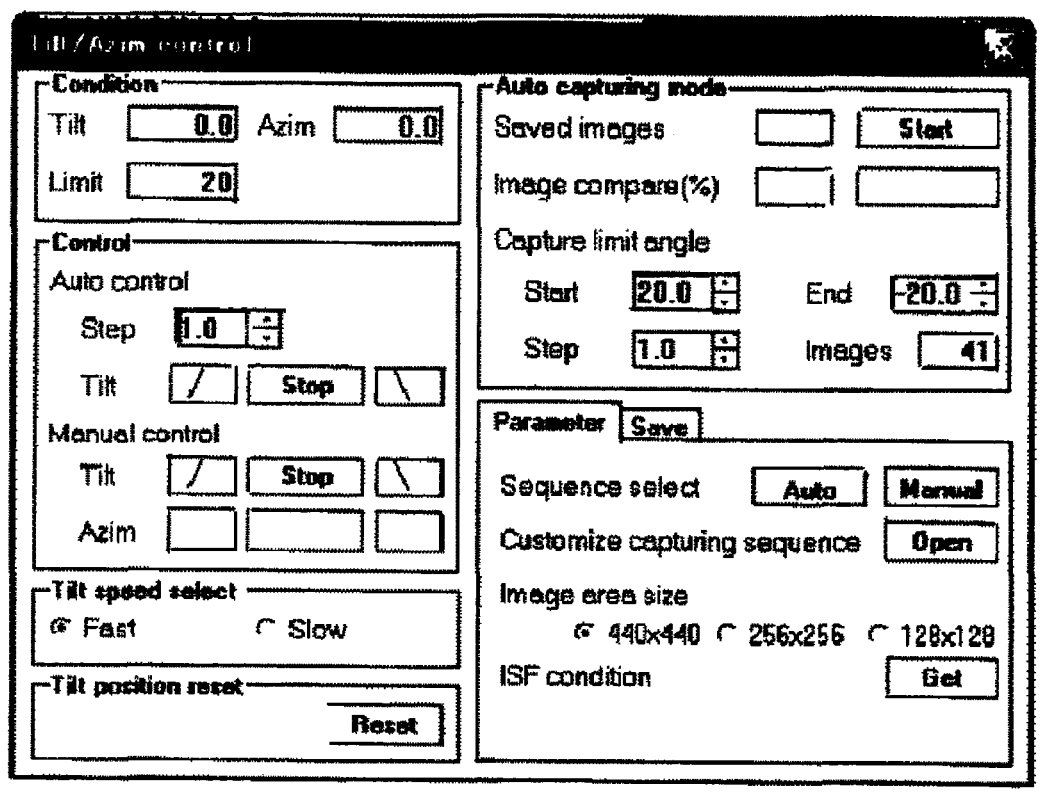
FIG. 7 is a diagram showing an example of an automatic specimen tilt control view.

One embodiment of the present invention will be described with reference to the flowchart of FIG. 2. As shown in FIG. 1, data on the lens system is output from a ROM 46 storing data on lenses for observation of a transmission image to digital-to-analog converters (DACs) 24, 25, 28, and 31 to 34 to be converted into analog signals. The analog signals are output from the DACs 24, 25, 28, and 31 to 34 to excitation power supplies 13, 14, 17, and 20 to 23 to output currents to lens coils 2, 3, 6, and 9 to 12 for the lens system. As shown in FIG. 7, a specimen tilting start angle, a termination angle, a step and a template size (image area size) are input.

Subsequently, the degree of matching ("Image compare") and the number of times correction is to be made ("Correction"), for prevention of erroneous operations, are input. A specimen stage is used by being tilted at a designated tilt angle to find a field of view.

Figure 3:
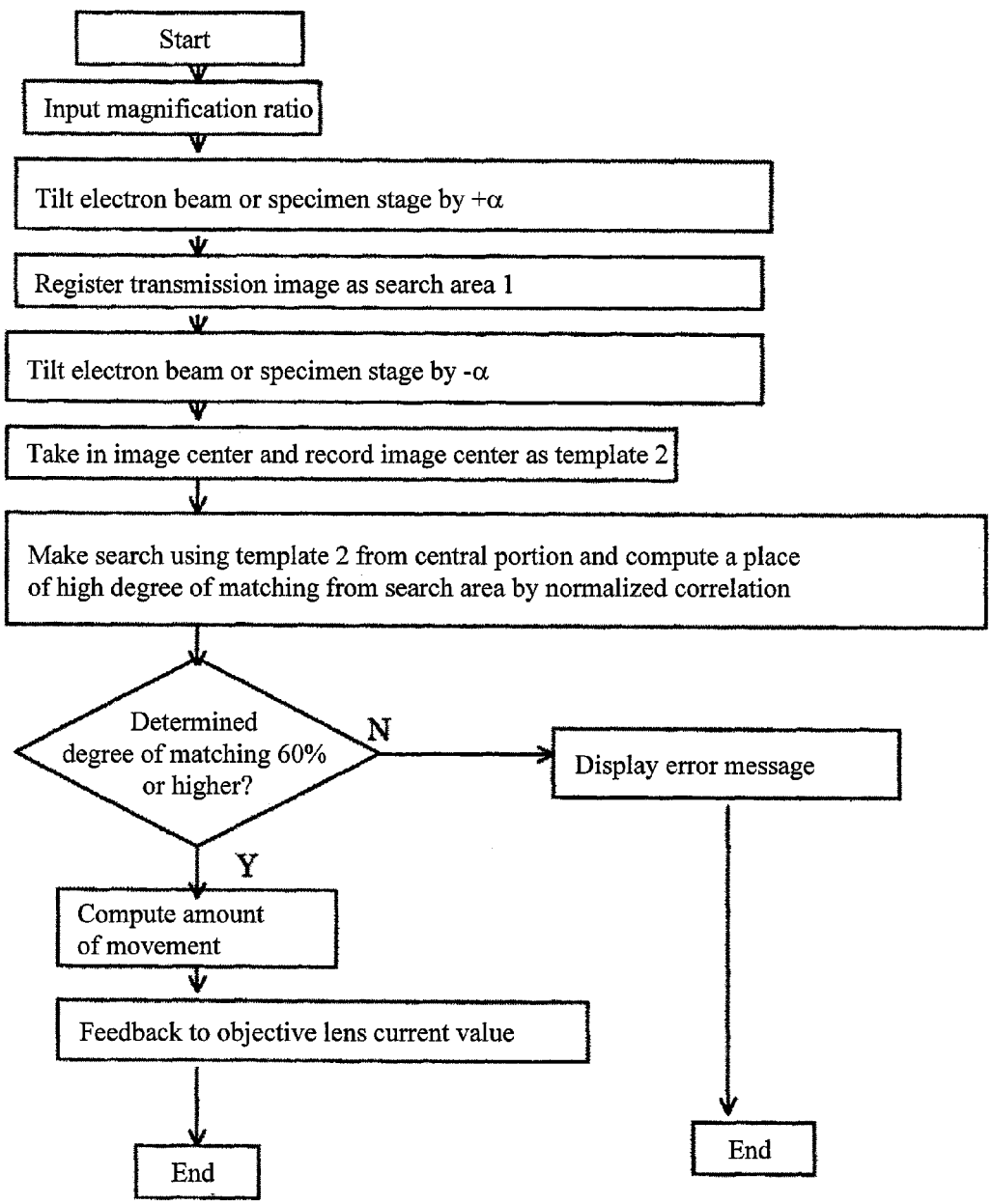
FIG. 3 is a flowchart showing the operation of the transmission electron microscope.
Figure 4:
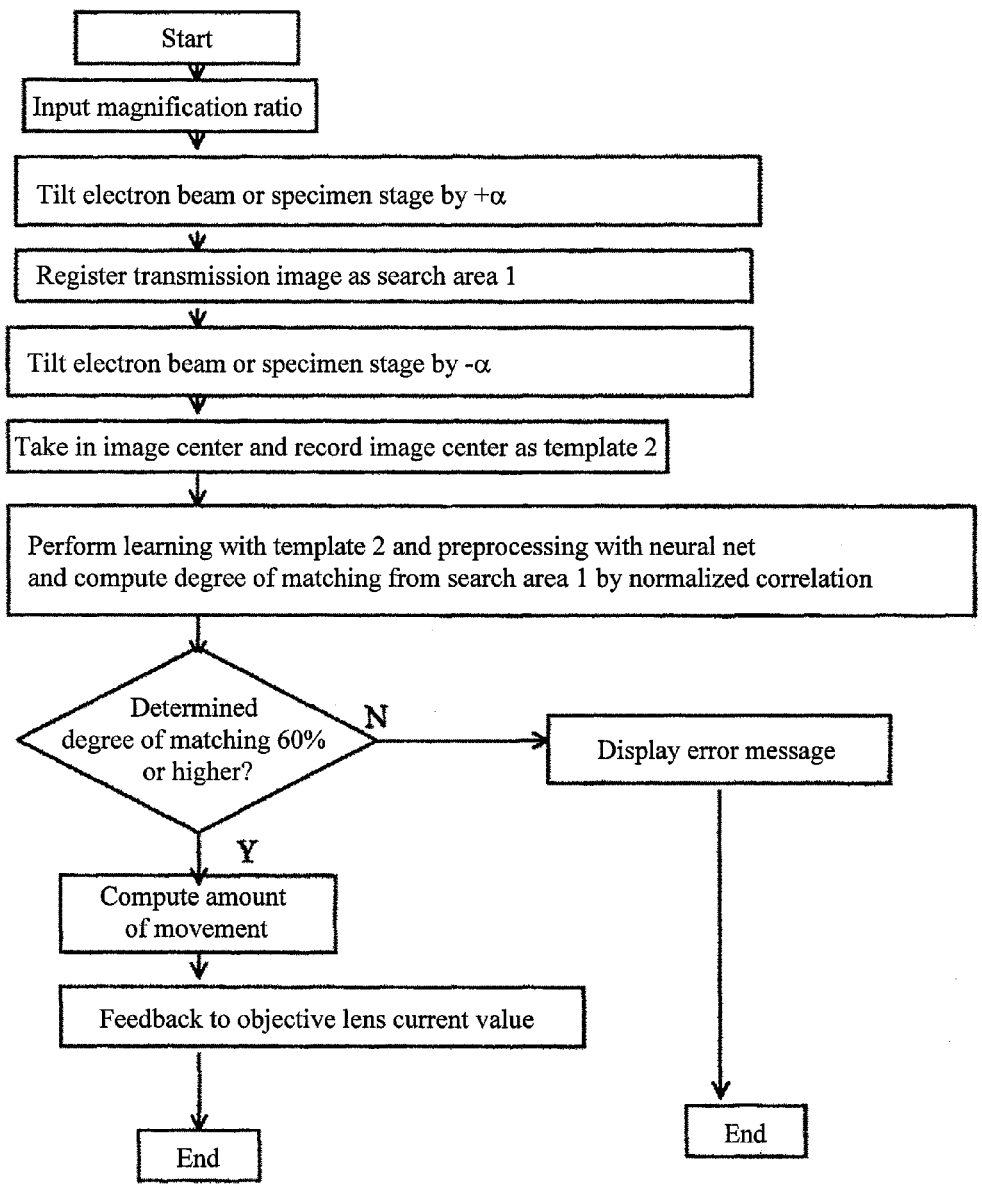
FIG. 4 is a flowchart showing the operation of the transmission electron microscope.
Figure 8:
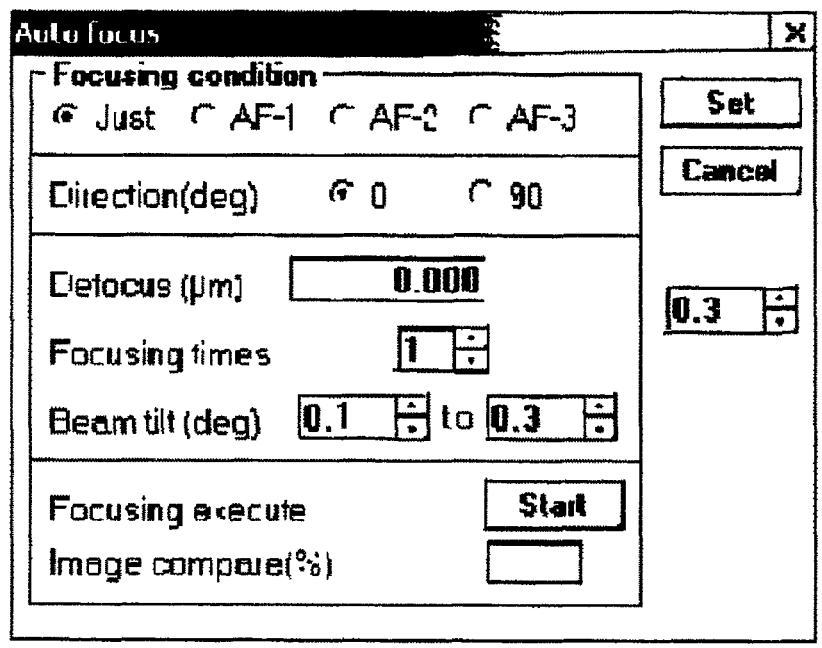
FIG. 8 is a diagram showing an example of an automatic focus correction control view.
Figure 9:
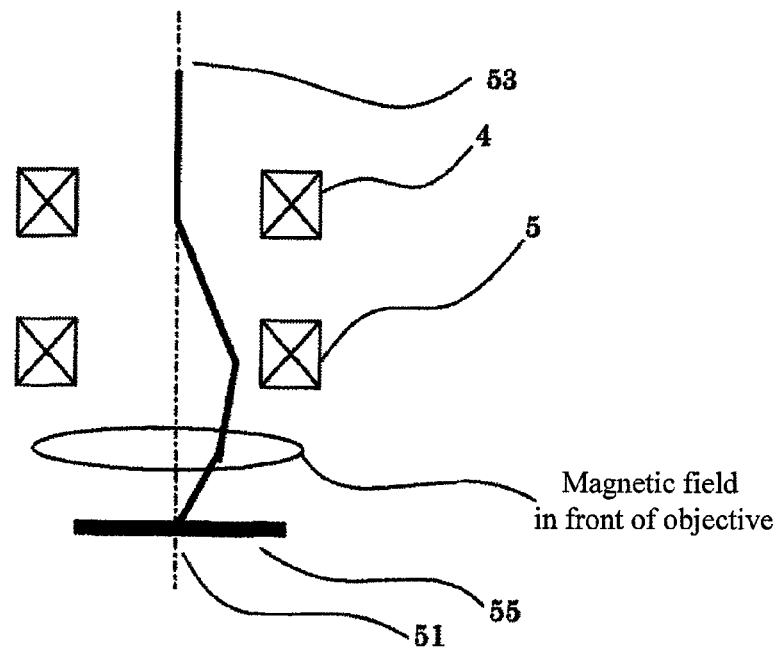
FIG. 9 is a diagram showing an example of an automatic focusing electronic optical system.

In "Auto Focus", a magnification ratio is input as shown in FIG. 3 or 4 on the basis of a setting on an automatic focus correction control view shown in FIG. 8, and tilting of the electron beam is performed at an angle of +α by using deflector coils, as shown in FIG. 9. A specimen stage shown in FIG. 11 may be used. In the description of the present embodiment, however, description is made of electron beam tilting. An image is taken in 640×480 pixels and recorded as a search area (1).

Figure 15:
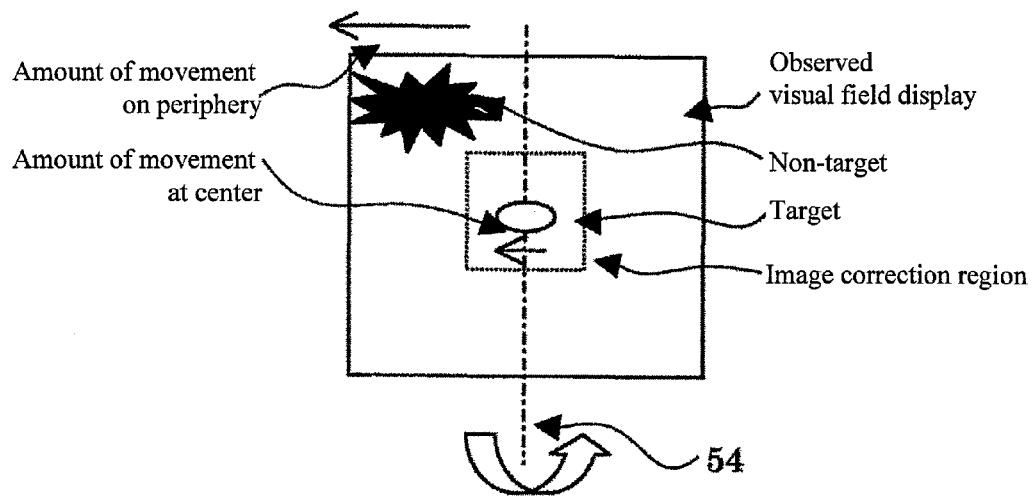
FIG. 15 is a diagram showing an example of a visual field having a characteristic contrast in a portion of an image.

An image is thereafter taken in by tilting the electron beam at an angle of +α and is recorded in 128×128 pixels as a template (2), as shown in FIG. 17. The amount of movement and the degree of matching between the two images are computed by using the above-described computation methods (C), (D), and (E) adopted in the present embodiment. If the degree of matching is 60% or higher, the object lens current is corrected according to the amount of movement to make a focus correction. If the degree of matching is lower than 60%, the operation may be stopped while displaying an error message. If only a target is set as a template as shown in FIG. 15, the amount of visual field shift is small in the case of tilting at ±60°.

If the template size is increased, the shift caused at each tilt angle is increased because correction is made at the image center. Therefore the template size may be made as small as possible for an improvement in accuracy.

After automatic focusing, a high-resolution image in 1 k×1 k or more pixels is taken in and the specimen is tilted. During tilting, the amount of image movement is computed according to a sampling time input, and correction is made with the specimen stage shown in FIG. 11. The amount of movement is computed during tilting by using the above-described computation methods (C), (D), and (E) adopted in the present embodiment. If the degree of matching is higher than a set value, the processing is continued.

Figure 27:
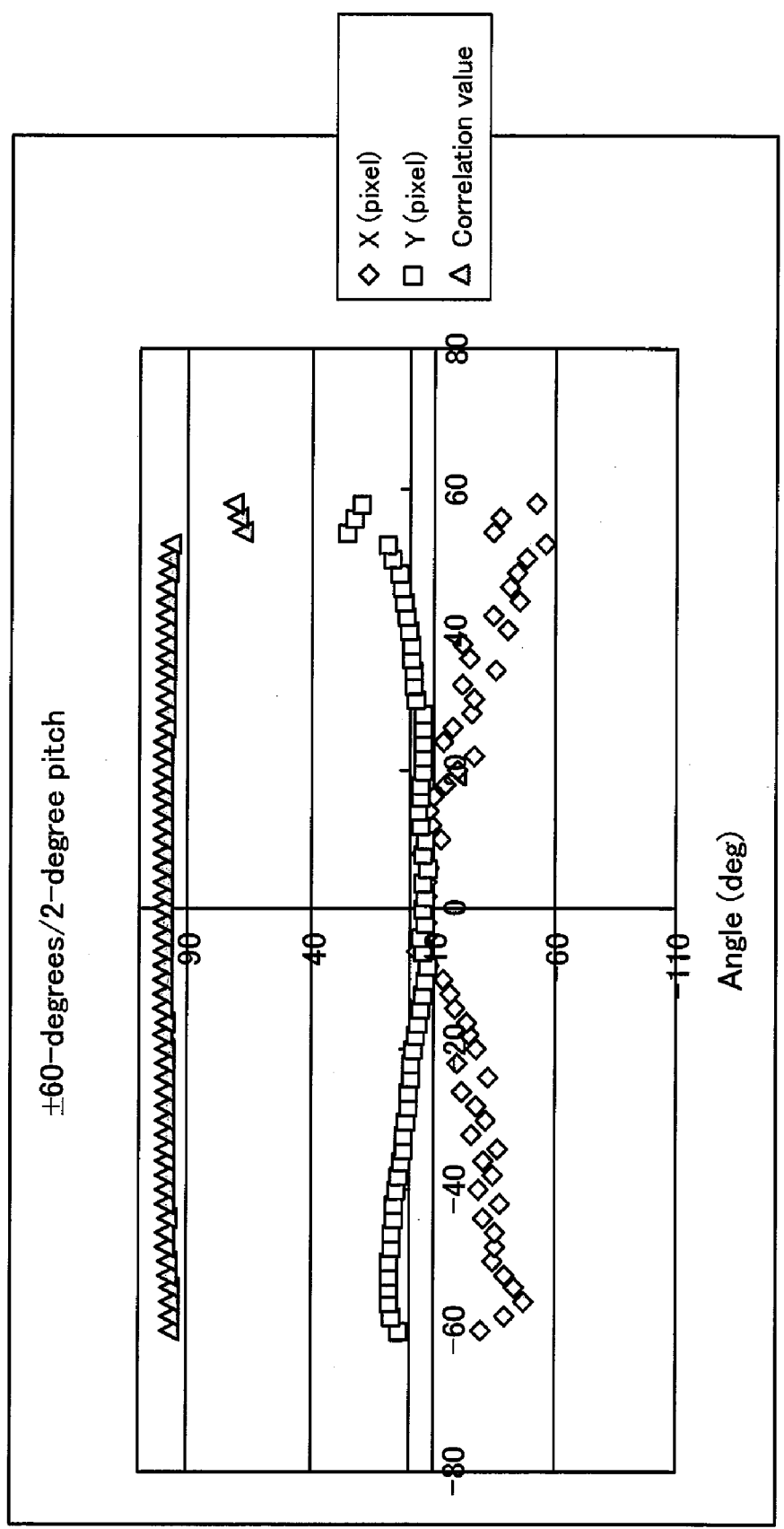
FIG. 27 is a diagram showing the relationship between the amount of image movement and the degree of matching at the time of specimen tilting in the embodiment of the present invention.

The computation methods in the present embodiment ensure a high degree of matching even in the case of tilting at ±60°, as shown in FIG. 27, thus facilitating matching degree setting in the event of occurrence of an erroneous operation. If the degree of matching is equal to or lower than 60% and lower than the set value, an error message is displayed and the operation is stopped.

After the completion of specimen tilting, the image is taken in and stored as a template (3). At this time, the final amount of movement and degree of matching are computed from the search area (1) and the template (3) by using the above-described computation methods (C), (D), and (E) adopted in the present embodiment, and positioning is performed with the specimen stage shown FIG. 11 or image shifting shown in FIG. 10.

The above-described operation is repeatedly performed to take in images until a set tilt angle is reached. The above-described computation methods (A) and (B) adopted in the present embodiment may be used.

Embodiment 2

Figure 5:
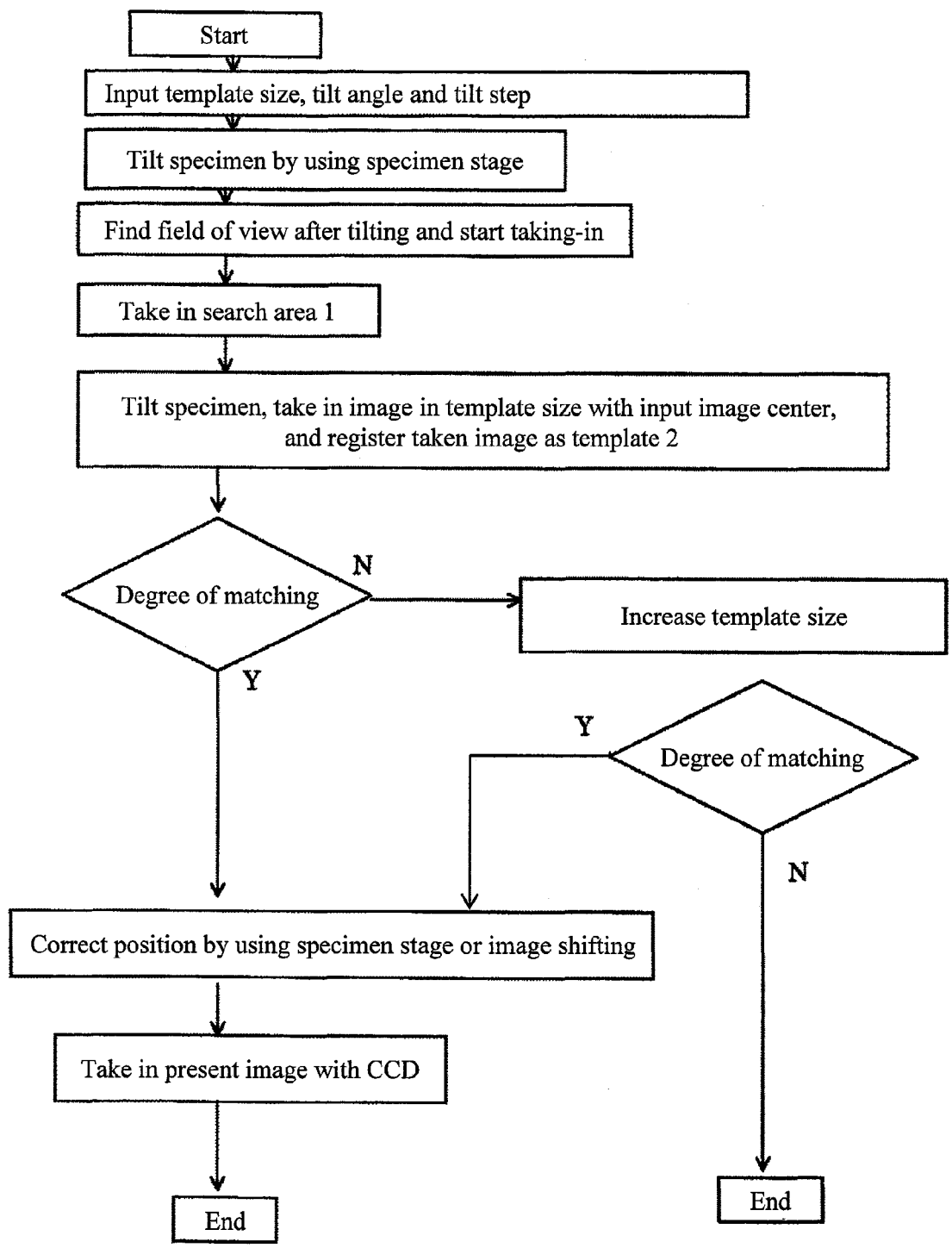
FIG. 5 is a flowchart showing the operation of the transmission electron microscope.

One embodiment of the present invention will be described with reference to the flowchart of FIG. 2. As shown in FIG. 1, data on the lens system is output from the ROM 46 storing data on lenses for observation of a transmission image to the DACs 24, 25, 28, and 31 to 34 to be converted into analog signals. The analog signals are output from the DACs 24, 25, 28, and 31 to 34 to the excitation power supplies 13, 14, 17, and 20 to 23 to output currents to the lens coils 2, 3, 6, and 9 to 12 for the lens system. Description will next be made of the flow shown in FIG. 5.

A template size, a tilt angle and a tilt step are first input, and the specimen stage is tilted. After specimen tilting, a field of view is found and an image is taken in and recorded as search area (1).

The specimen is tilted and an image is taken in a template size with an input image center to be stored as template (2).

Figure 28:
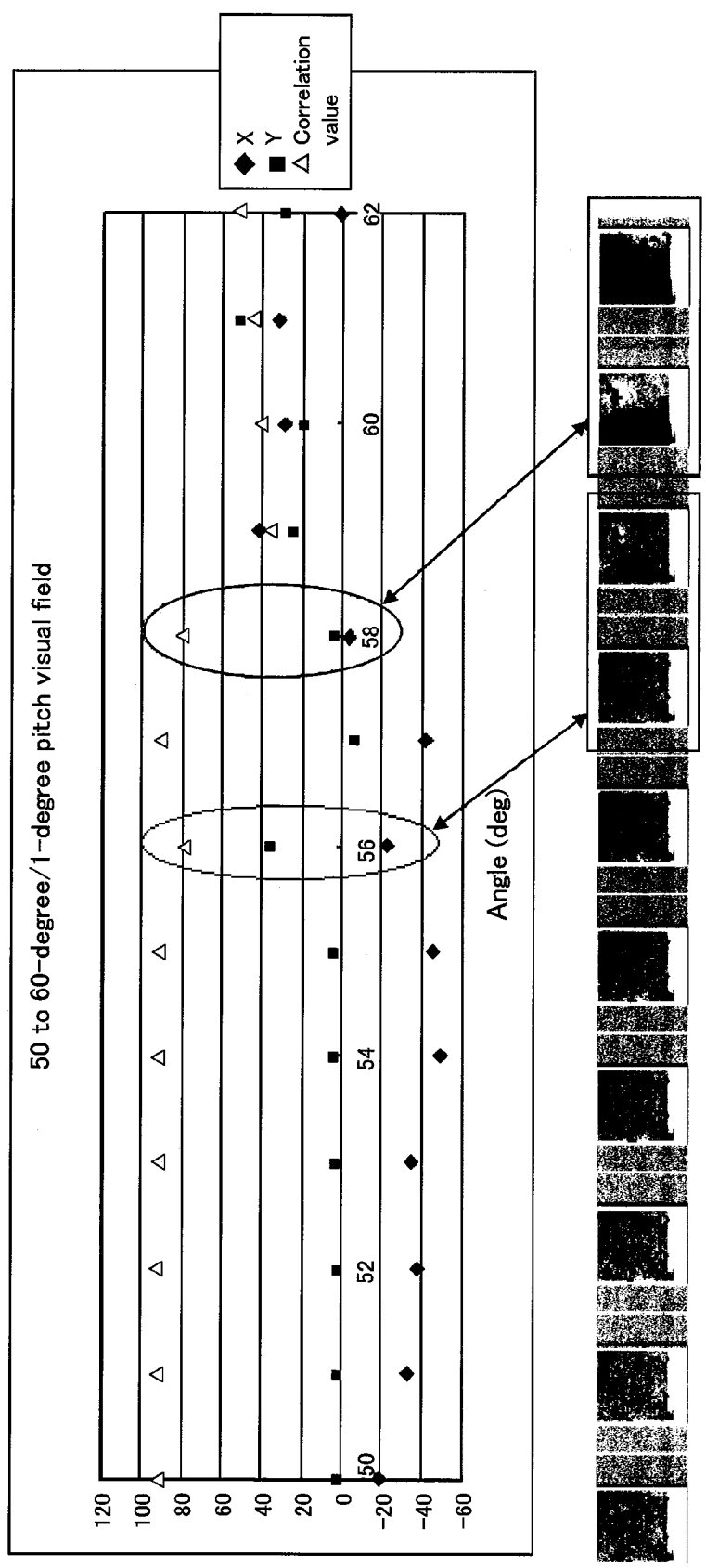
FIG. 28 is a diagram showing the relationship between the amount of image movement and the degree of matching at the time of specimen tilting (128 pixels)
Figure 29:
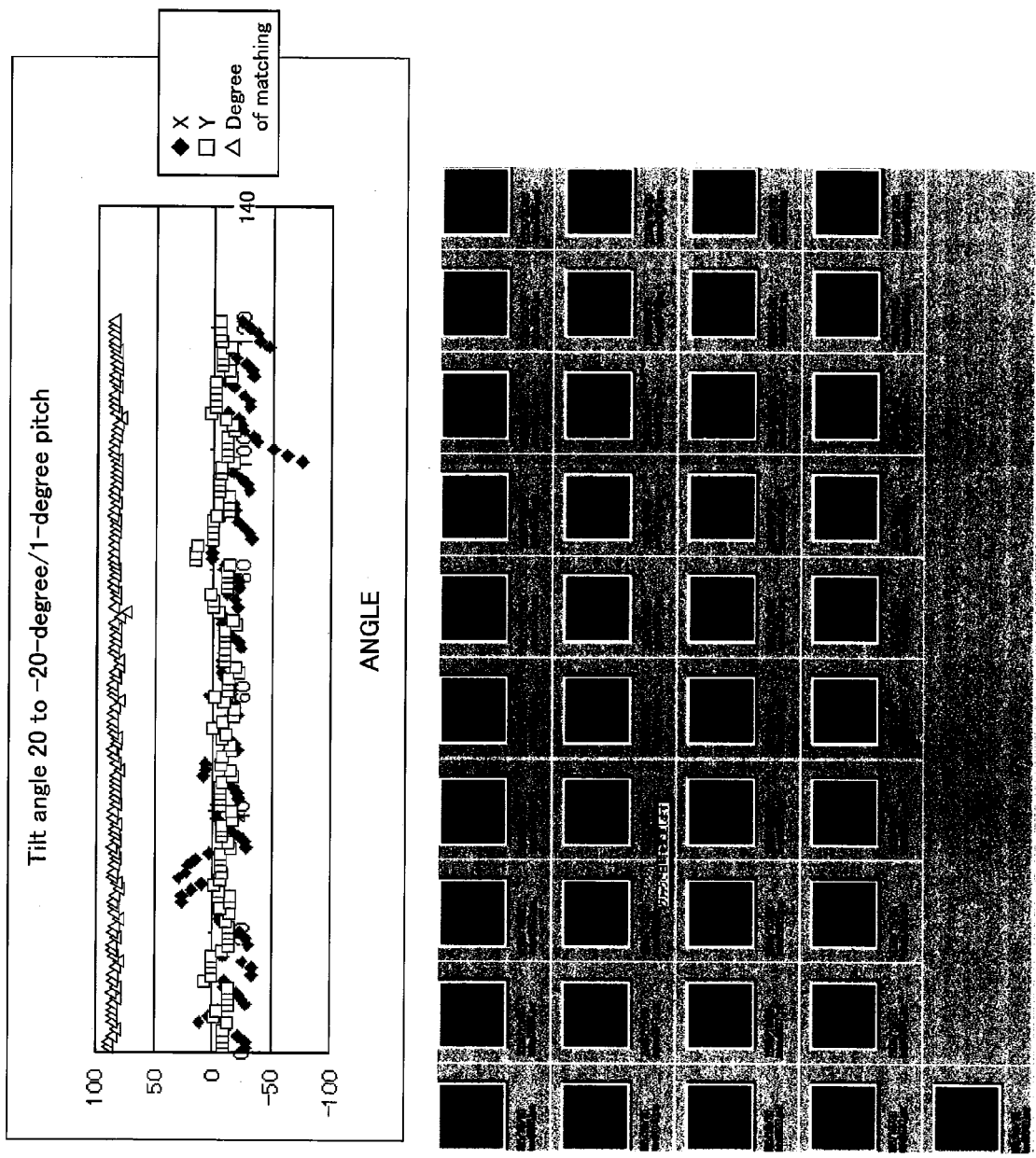
FIG. 29 is a diagram showing the relationship between the amount of image movement and the degree of matching at the time of specimen tilting (256 pixels).

The amount of movement is computed by using the above-described computation methods (C), (D), and (E) adopted in the present embodiment. If the degree of matching is equal to or lower than 80%, the template size is increased and the amount of movement and the degree of matching are again computed. FIG. 28 shows an example of occurrence of an erroneous operation in a case where similar particles exist in the images. FIG. 29 shows an example of computation of the degree of matching in a case where the template is changed from 128 pixels to 256 pixels. As can be understood from the results, a larger feature amount of the image can be taken if the template size is increased. In some case, therefore, prevention of an erroneous operation and recomputation are enabled by changing the template size.

Figure 10:
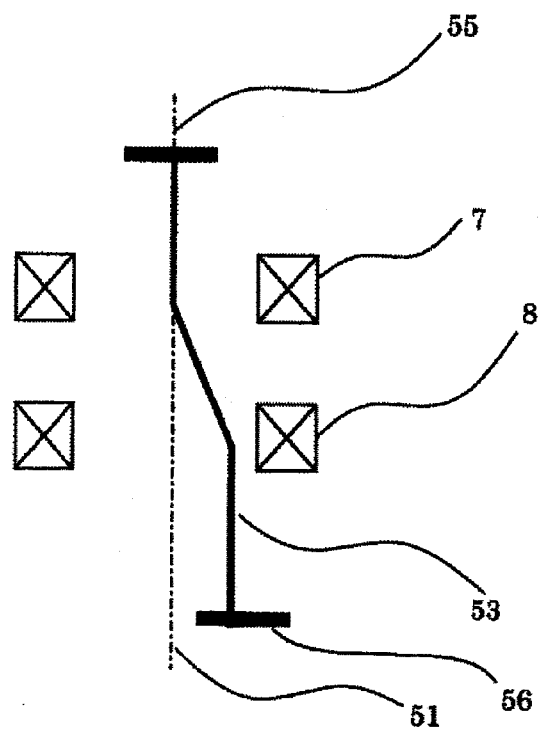
FIG. 10 is a diagram showing an example of an image shift.
Figure 11:
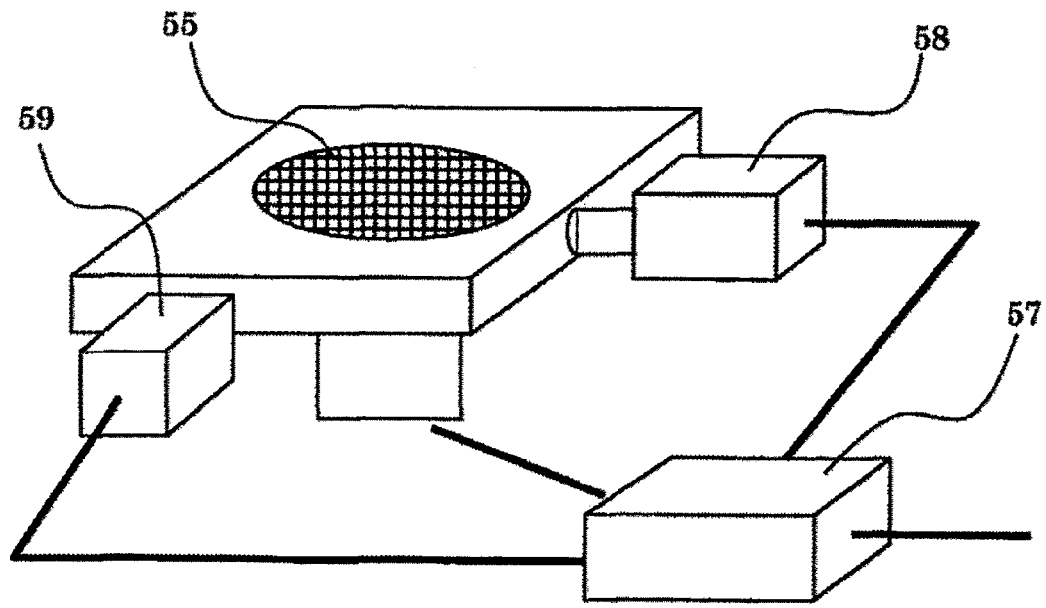
FIG. 11 is a diagram showing an example of a specimen stage.

If the degree of matching exceeds 80%, correction is made by using image shifting shown in FIG. 10 and the specimen stage shown in FIG. 11. The above-described computation methods (A) and (B) adopted in the present embodiment may be used.

Embodiment 3

One embodiment of the present invention will be described with reference to the flowchart of FIG. 2. As shown in FIG. 1, data on the lens system is output from the ROM 46 storing data on lenses for observation of a transmission image to the DACs 24, 25, 28, and 31 to 34 to be converted into analog signals. The analog signals are output from the DACs 24, 25, 28, and 31 to 34 to the excitation power supplies 13, 14, 17, and 20 to 23 to output currents to the lens coils 2, 3, 6, and 9 to 12 for the lens system.

Figure 6:
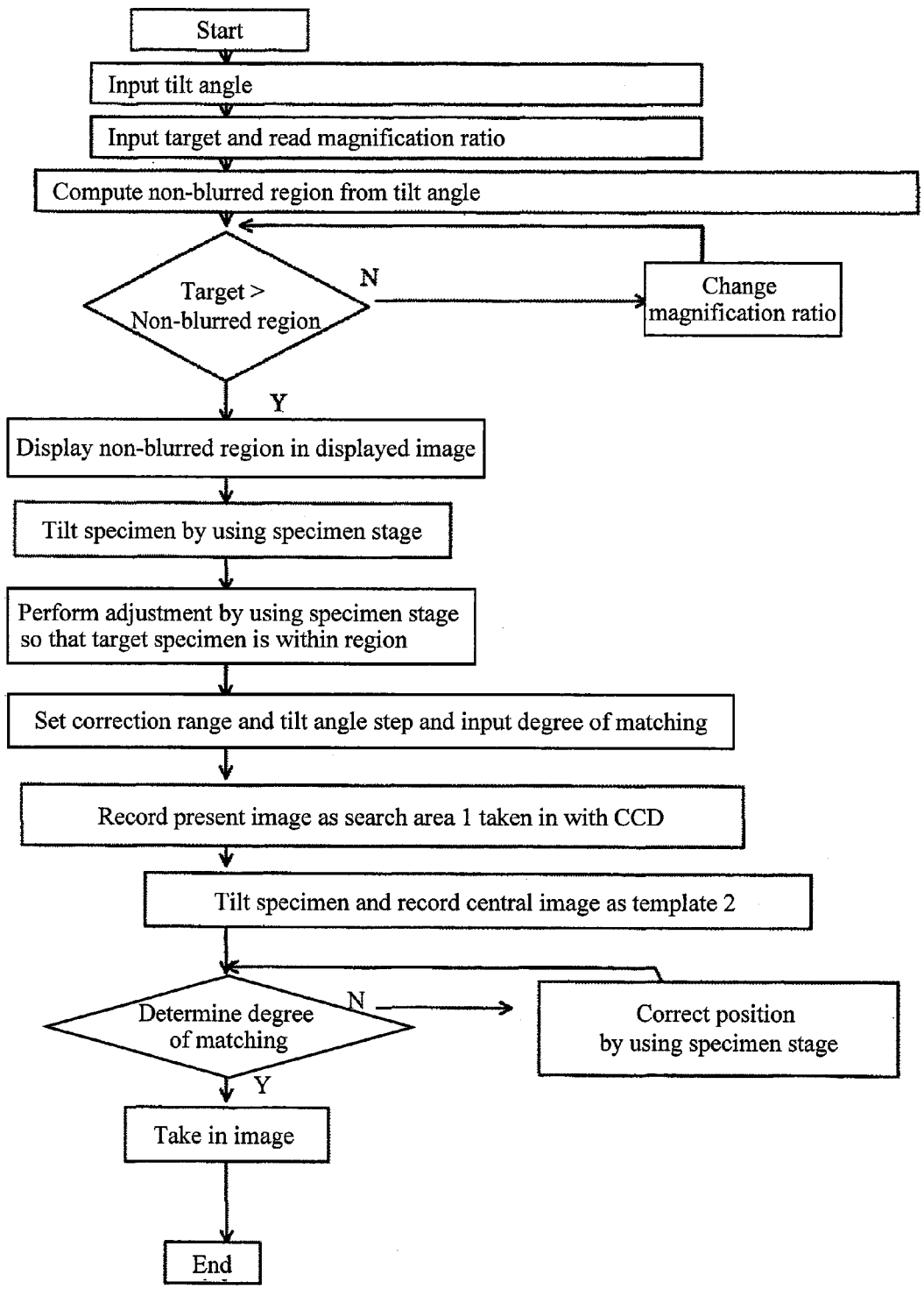
FIG. 6 is a flowchart showing the operation of the transmission electron microscope.

Description will next be made of the flow shown in FIG. 6. As shown in FIG. 7, a specimen tilting start angle, a termination angle, a step and a template size (image area size) are input. Subsequently, the degree of matching ("Image compare") and the number of times correction is to be made ("Correction"), for prevention of erroneous operations, are input.

Figure 12:
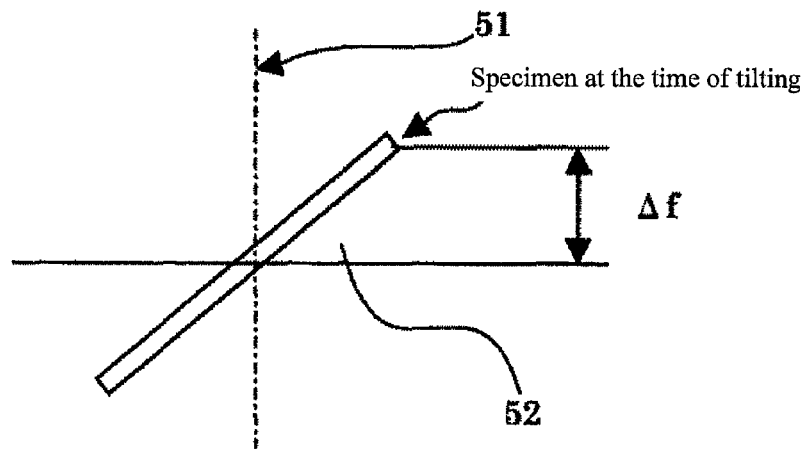
FIG. 12 is a diagram showing an example of a specimen tilting mechanism.
Figure 13:
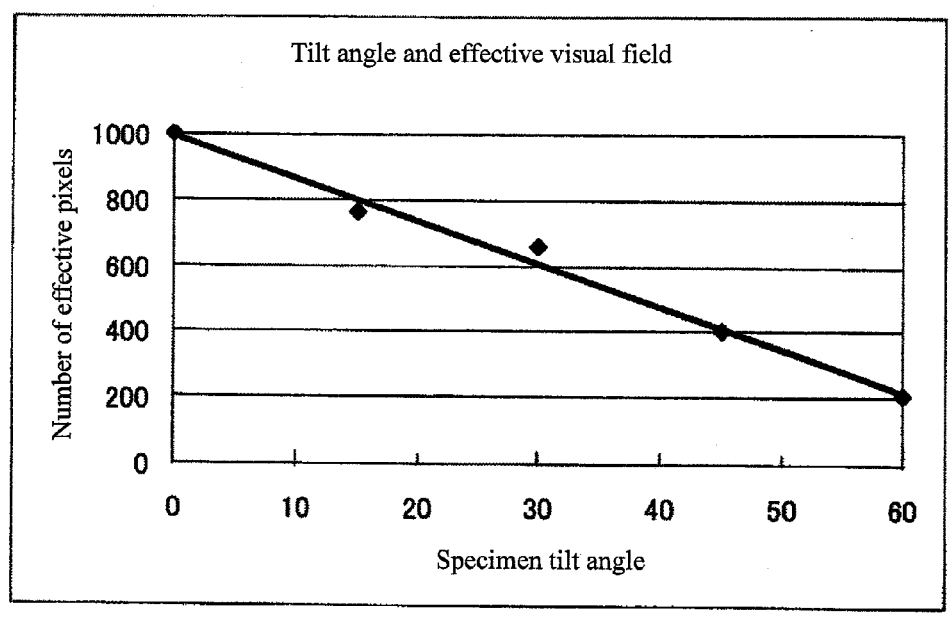
FIG. 13 is a diagram showing the relationship between the tilt angle and the number of effective pixels.
Figure 14:
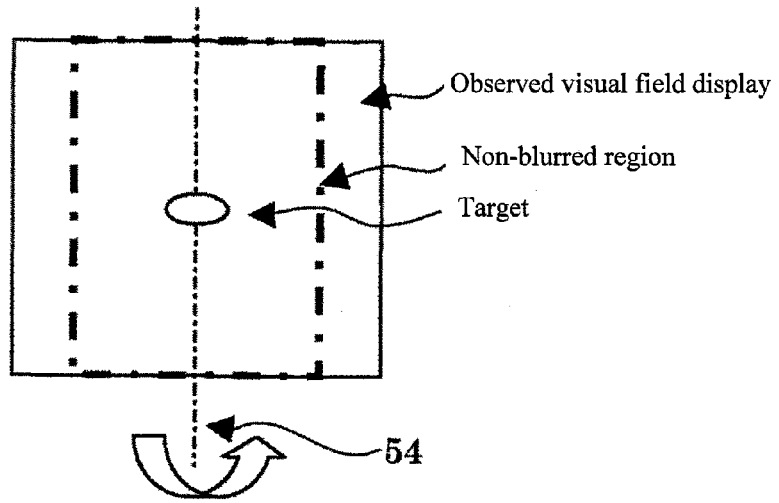
FIG. 14 is a diagram showing an example of a discriminative display of a non-blurred region on an image.

If the specimen is tilted as shown in FIG. 12, a defocus of Δf occurs at a peripheral position. Therefore a non-blurred region on a CCD camera is determined depending on the tilt angle, as shown in FIG. 13. Blurred regions are separately formed on left and right sides about the tilt center, as shown in FIG. 14. Display is performed by computing this. If the target is within the non-blurred region, the magnification ratio is not changed. If the target extends out of the non-blurred region, the magnification ratio is changed.

The specimen stage is thereafter tilted at a designated tilt angle to find a field of view. Subsequently, an image is taken in and recorded as search area (1). The specimen is thereafter tilted and an image is taken in and a central image is recorded as template (2). Correction is made by means of image shifting shown in FIG. 10 or the specimen stage shown in FIG. 11, and by using the above-described computation methods (C), (D), and (E) adopted in the present embodiment. For template search, the above-described computation methods (A) and (B) adopted in the present embodiment may be used.

As described above, a first transmission image of a specimen is obtained with an electron beam applied in a first direction and a second transmission image is obtained with the electron beam applied in a direction different from the first direction. The second transmission image corresponds to an area on the specimen narrower than that corresponding to the first image, and is formed within a region different from a peripheral blurred region resulting from tilting. A search using the second transmission image is made in the first transmission image. In this way, a high search accuracy can be achieved regardless of the existence of the peripheral blurred region caused due to tilting of the beam or the specimen.

What is claimed is:

1. An image forming method in which an image is formed based on a comparison between a plurality of images obtained by applying an electron beam to a specimen at different tilt angles, the method comprising:
   obtaining a first transmission image with the electron beam applied in a first direction;
   obtaining a second transmission image with the electron beam applied in a direction that is different from the first direction, the second transmission image corresponding to an area on the specimen that is smaller than that corresponding to the first image, and the second transmission image being formed within a region that lies outside a peripheral region that is blurred due to tilting; and
   performing a correlation search in the first transmission image using the second transmission image.

2. A transmission electron microscope comprising:
   an electron gun;
   a converging lens which applies an electron beam to a specimen;
   a mechanism for deflecting the electron beam;
   an objective lens arranged to focus on the specimen;
   an imaging lens which expands the electron beam transmitted through the specimen;
   a mechanism for taking in a transmission image as image data;
   means for obtaining an image movement amount and a correlation value by performing image processing using first and second specimen transmission images acquired at different electron beam tilt angles; wherein
   the first specimen transmission image comprises a search area image, the entire area of which is to be searched; and
   the second specimen transmission image, at the other tilt, is formed of an image central portion to be used as a template image.

3. The transmission electron microscope according to claim 2, comprising:
   a specimen stage; and
   means for obtaining an image movement amount and a correlation value by performing image processing using first and second specimen transmission images at different specimen tilt angles.

4. A transmission electron microscope comprising:
   an electron gun;
   a converging lens which applies an electron beam to a specimen;
   a mechanism for deflecting the electron beam;
   an objective lens arranged to focus on the specimen;
   an imaging lens which expands the electron beam transmitted through the specimen;
   a specimen stage;
   a mechanism for taking in a transmission image as image data;
   means for obtaining an image movement amount and a correlation value by performing image processing using first and second specimen transmission images acquired at different electron beam tilt angles; wherein,
   the first specimen transmission image comprises a search area image, the entire area of which is to be searched; and
   the second specimen transmission image, at the other tilt, is formed of a region that is smaller than, and lies within, a region where no blur occurs due to the tilt angle, to be used as a template image.

5. A transmission electron microscope comprising:
   an electron gun;
   a converging lens which applies an electron beam to a specimen;
   a mechanism for deflecting the electron beam;
   an objective lens arranged to focus on a specimen;
   an imaging lens which expands the electron beam transmitted through the specimen;
   a mechanism for taking in a transmission image as image data; and
   means for obtaining an image movement amount and a correlation value by normalized correlation pattern matching using first and second specimen transmission images acquired at different electron beam tilt angles; wherein,
   the first specimen transmission image comprises a search area image, the entire area of which is to be searched; and
   the second specimen transmission image, at the other tilt, is formed of an image central portion to be used as a template image.

6. The transmission electron microscope according to claim 5, comprising:
   a specimen stage; and
   means for obtaining an image movement amount and a correlation value by normalized correlation pattern matching using first and second specimen transmission acquired images at different specimen tilt angles.

7. A transmission electron microscope comprising:
   an electron gun;
   a converging lens which applies an electron beam to a specimen;
   a mechanism for deflecting the electron beam;
   an objective lens arranged to focus on a specimen;
   an imaging lens which expands the electron beam transmitted through the specimen;
   a specimen stage;
   a mechanism for taking in a transmission image as image data;
   means for obtaining an image movement amount and a correlation value by normalized correlation pattern matching using first and second specimen transmission images, acquired at different electron beam tilt angles; wherein
   the first specimen transmission image comprises a search area image, the entire area of which is to be searched; and
   the second specimen transmission image, at the other tilt, is formed of a region that is smaller than, and lies within, a region where no blur occurs due to the tilt angle, to be used as a template image.

8. A transmission electron microscope comprising:
   an electron gun;
   a converging lens which applies an electron beam to a specimen;
   a mechanism for deflecting the electron beam;
   an objective lens arranged to focus on a specimen;
   an imaging lens which expands the electron beam transmitted through the specimen;
   a mechanism for taking in a transmission image as image data;
   means for obtaining an image movement amount and a correlation value by performing image processing using first and second specimen transmission images acquired at different electron beam tilt angles, and using phase-limited correlation; wherein, the first specimen transmission image comprises a search area image, the entire area of which is to be searched; and the second specimen transmission image, at the other tilt, is formed of an image central portion to be used as a template image.

9. The transmission electron microscope according to claim 8, comprising:

a specimen stage; and means for obtaining an image movement amount and a correlation value by performing image processing using first and second specimen transmission images at different specimen tilt angles, and using phase-limited correlation.

10. A transmission electron microscope comprising:

an electron gun;

a converging lens which applies an electron beam to a specimen;

a mechanism for deflecting the electron beam;

an objective lens arranged to focus on a specimen;

an imaging lens which expands the electron beam transmitted through the specimen;

a specimen stage;

a mechanism for taking in a transmission image as image data; and means for obtaining an image movement amount and a correlation value by performing image processing using first and second specimen transmission images acquired at different electron beam tilt angles, and using phase-limited correlation; wherein, the first specimen transmission image comprises a search area image, the entire area of which is to be searched; and the second specimen transmission image, at the other tilt, is formed of a region that is smaller than, and lies within, a region where no blur occurs due to the tilt angle, to be used as a template image.

* * * * *